United States Patent
Choi

(10) Patent No.: US 9,685,955 B2
(45) Date of Patent: Jun. 20, 2017

(54) GATE DRIVER CIRCUIT AND GATE DRIVING METHOD FOR PREVENTION OF ARM SHORT

(71) Applicant: HYUNDAI MOBIS CO., LTD., Seoul (KR)

(72) Inventor: Moon-Gyu Choi, Yongin-si (KR)

(73) Assignee: HYUNDAI MOBIS CO., LTD., Seoul (KR)

(*) Notice: Subject to any disclaimer, the term of this patent is extended or adjusted under 35 U.S.C. 154(b) by 83 days.

(21) Appl. No.: 14/702,451

(22) Filed: May 1, 2015

(65) Prior Publication Data
US 2016/0173094 A1    Jun. 16, 2016

(30) Foreign Application Priority Data
Dec. 10, 2014    (KR) .................. 10-2014-0177561

(51) Int. Cl.
H03K 3/00         (2006.01)
H03K 19/0175      (2006.01)

(52) U.S. Cl.
CPC .................. *H03K 19/017518* (2013.01)

(58) Field of Classification Search
USPC ............................................. 327/109
See application file for complete search history.

(56) References Cited

U.S. PATENT DOCUMENTS

| 8,503,146 B1 | 8/2013 | Shekhawat |
| 8,810,984 B2 | 8/2014 | Hussein et al. |
| 9,275,573 B2* | 3/2016 | Lee ............... G09G 3/3233 |
| 2011/0273206 A1* | 11/2011 | Lee .................. H02M 1/08 |
| | | 327/109 |

FOREIGN PATENT DOCUMENTS

| JP | 3548497 B2 | 4/2004 |
| JP | 2011-172446 A | 9/2011 |
| KR | 10-1198413 B1 | 10/2012 |

* cited by examiner

*Primary Examiner* — Lincoln Donovan
*Assistant Examiner* — Patrick Chen
(74) *Attorney, Agent, or Firm* — Knobbe Martens Olson & Bear LLP

(57) ABSTRACT

A gate driver circuit for prevention of an arm short may include a drive controller configured to a gate drive signal, a drive signal transfer portion configured to amplify the gate drive signal and output the amplified gate drive signal, a variable resistance portion configured to change a time constant of the amplified gate drive signal using an internal resistance and output the amplified gate drive signal having the changed time constant to a gate of a semiconductor device, and a resistance controller configured to compare a first DESAT pin voltage of the drive controller with a first predetermined reference value and control the internal resistance of the variable resistance portion using the comparison result with the first predetermined reference value to perform a first driver circuit protection.

16 Claims, 8 Drawing Sheets

GATE DRIVER CIRCUIT AND GATE DRIVING METHOD FOR PREVENTION OF ARM SHORT

CROSS-REFERENCE(S) TO RELATED APPLICATION(S)

This application claims the benefit of priority to Korean Patent Application No(s). 10-2014-0177561 filed on Dec. 10, 2014, the entire contents of which are incorporated herein by reference.

BACKGROUND

The present disclosure relates to a gate driver circuit and a gate driving method for prevention of an arm short.

In a hybrid vehicle or an electric vehicle, an inverter gate drive board may be provided for converting electric power. The inverter gate drive board may include a gate driver circuit for driving a semiconductor device (IGBT; Insulated Gate Bipolar Transistor) and may be configured to protect the IGBT from damages.

SUMMARY

An embodiment of the present invention is directed to a gate driver circuit and a gate driving method for prevention of an arm short, capable of previously preventing damage of a semiconductor device operated by a gate drive signal by previously detecting a situation in which an arm short is generated in the gate driver circuit so as to change a time constant of the gate drive signal.

Another embodiment of the present invention is directed to a gate driver circuit and a gate driving method for prevention of an arm short, capable of preventing damage of a semiconductor device operated by a gate drive signal by previously detecting a situation in which an arm short is generated in the gate driver circuit so as to stop output of the gate drive signal, so that the gate driver circuit is reoperated.

Other aspects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a gate driver circuit for prevention of an arm short includes a drive controller configured to a gate drive signal, a drive signal transfer portion configured to amplify the gate drive signal and output the amplified gate drive signal, a variable resistance portion configured to change a time constant of the amplified gate drive signal using an internal resistance and output the amplified gate drive signal having the changed time constant to a gate of a semiconductor device, and a resistance controller configured to compare a first DESAT pin voltage of the drive controller with a first predetermined reference value and control the internal resistance of the variable resistance portion using the comparison result with the first predetermined reference value to perform a first driver circuit protection.

The drive controller compares a second DESAT pin voltage of the drive controller with a second predetermined reference value after the performance of the first driver circuit protection and sends to a microcomputer a fault signal which blocks the gate drive signal from the drive controller using the comparison result with the second predetermined reference value to perform a second driver circuit protection.

The drive signal transfer portion may include a first transistor configured to amplify a gate drive signal input to a base thereof, and a second transistor configured to amplify a gate drive signal input to a base thereof. Here, a voltage of 15V may be applied to a collector of the first transistor and an emitter of the first transistor may be connected to the variable resistance portion and a voltage of −5V may be applied to a collector of the second transistor and an emitter of the second transistor may be connected to the variable resistance portion.

The variable resistance portion may include a first resistance portion configured such that a second resistance (R2) is connected in parallel to a first resistance (R1), a first switch device (SW1) is connected in parallel to the first resistance, and the first switch device (SW1) is connected in series to the second resistance (R2), and a second resistance portion configured such that a third resistance (R3) is connected in parallel to a fourth resistance (R4), a second switch device (SW2) is connected in parallel to the fourth resistance (R4), and the second switch device (SW2) is connected in series to the third resistance (R3). Here, one end of the first resistance (R1) may be connected to an emitter of a first transistor and the other end of the first resistance (R1) may be connected to one end of the fourth resistance (R4) and the gate of the semiconductor device, one end of the fourth resistance (R4) may be connected to the other end of the first resistance (R1) and the other end of the fourth resistance (R4) may be connected to an emitter of a second transistor, the first switch device (SW1) may be connected to an output terminal of a first operational amplifier of the resistance controller, and the second switch device (SW2) may be connected to an output terminal of a second operational amplifier of the resistance controller.

The resistance controller may include a first operational amplifier configured such that an input terminal of the first operational amplifier is connected to a DESAT pin of the drive controller and a reference voltage source and an output terminal of the first operational amplifier is connected to a first switch device (SW1) of the variable resistance portion, and a second operational amplifier configured such that an input terminal of the second operational amplifier is connected to the DESAT pin of the drive controller and the reference voltage source and an output terminal of the second operational amplifier is connected to a second switch device (SW2) of the variable resistance portion.

The gate drive signal may be a PWM (Pulse Width Modulation) signal. The semiconductor device may be a high-capacity IGBT (Insulated Gate Bipolar Transistor) for power.

The second DESAT pin voltage is the sum of voltages of a resistor and a diode which are composed between a DESAT pin and the semiconductor device and a saturation voltage of the semiconductor device.

In accordance with another embodiment of the present invention, a gate driving method for prevention of an arm short includes performing drive signal output in which a drive controller outputs a gate drive signal, performing gate drive signal amplification in which a drive signal transfer portion amplifies the gate drive signal and outputs the amplified gate drive signal, performing arm short prediction in which a resistance controller determines whether or not the arm short prediction is generated comparing a first DESAT pin voltage of the drive with a first predetermined reference value, and performing first driver circuit protection in which a variable resistance portion changes a time constant of the amplified gate drive signal using an internal resistance according to the comparison result with the first predetermined reference value and outputs the amplified gate drive signal having the changed time constant to a gate of a semiconductor device to perform a first driver circuit protection.

The method future comprises further after the performing first driver circuit protection, performing arm short detection in which the drive controller determines whether or not a second DESAT pin voltage is equal to or greater than a second predetermined reference value, and performing second driver circuit protection in which the drive controller transfers to a microcomputer a fault signal which blocks the gate drive signal to stop output of the gate drive signal when the second DESAT pin voltage is equal to or greater than the second predetermined reference value.

The performing drive signal output is performed again after driver circuit reoperation in which the resistance controller closes (ON) the first switch device (SW1) of the variable resistance portion and opens (OFF) the second switch device (SW2) is performed when the first DESAT pin voltage of the drive controller is equal to or less than the first predetermined reference value in the performing arm short prediction.

The performing drive signal output may be performed again after driver circuit reoperation in which the resistance controller closes (ON) the first switch device (SW1) of the variable resistance portion and opens (OFF) the second switch device (SW2) is performed when the DESAT pin voltage of the drive controller is equal to or less than the predetermined value in the performing arm short prediction. In a case in which the resistance controller closes (ON) the first switch device (SW1) of the variable resistance portion and opens (OFF) the second switch device (SW2) in the performing driver circuit reoperation, a resistance value ($R_{S1}$) of a first resistance portion and a resistance value ($R_{S2}$) of a second resistance portion may be calculated by the following equations:

$$R_{S1} = \frac{R1 \times R2}{R1 + R2}$$

$$R_{S2} = R4.$$

In a case in which the resistance controller opens (OFF) the first switch device (SW1) of the variable resistance portion and closes (ON) the second switch device (SW2) in the performing first driver circuit protection, a resistance value ($R_{S1}$) of a first resistance portion and a resistance value ($R_{S2}$) of a second resistance portion may be calculated by the following equations:

$$R_{S1} = R1$$

$$R_{S2} = \frac{R3 \times R4}{R3 + R4}.$$

The performing arm short prediction may be performed again when the DESAT pin voltage is less than the certain value in the performing arm short detection.

After the performing second driver circuit protection, performing drive signal output may be performed again after driver circuit reoperation in which the resistance controller closes (ON) a first switch device (SW1) of the variable resistance portion and opens (OFF) a second switch device (SW2) is performed.

DESCRIPTION OF EMBODIMENTS

Figure 1:
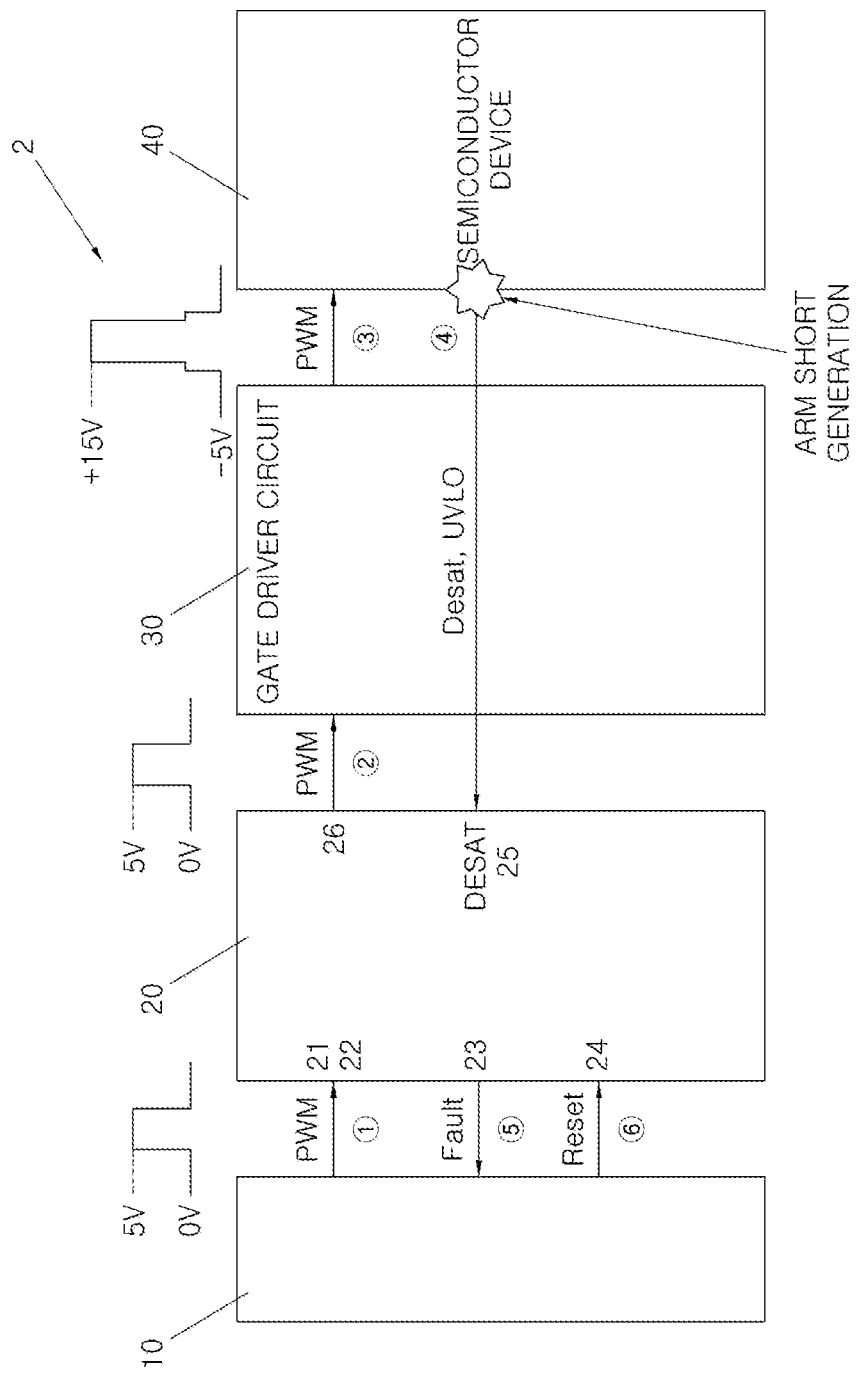
FIG. 1 is a conceptual diagram illustrating an inverter gate drive board to which a gate driver circuit is applied.

The technical terminology used in the present disclosure is for the purpose of describing particular embodiments only and is not intended to limit the invention. In addition, unless otherwise defined, all terms including technical and scientific terms used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. In addition, the embodiments described in the present specification and the construction shown in the drawings are nothing but one embodiment of the present invention, and the invention is not limited thereto. Thus, it should be understood that various changes and modifications may be made without departing from the spirit and scope of the invention.

Hereinafter, a gate driver circuit for prevention of an arm short according to an embodiment of the present invention will be described with reference to the accompanying drawings.

Figure 2:
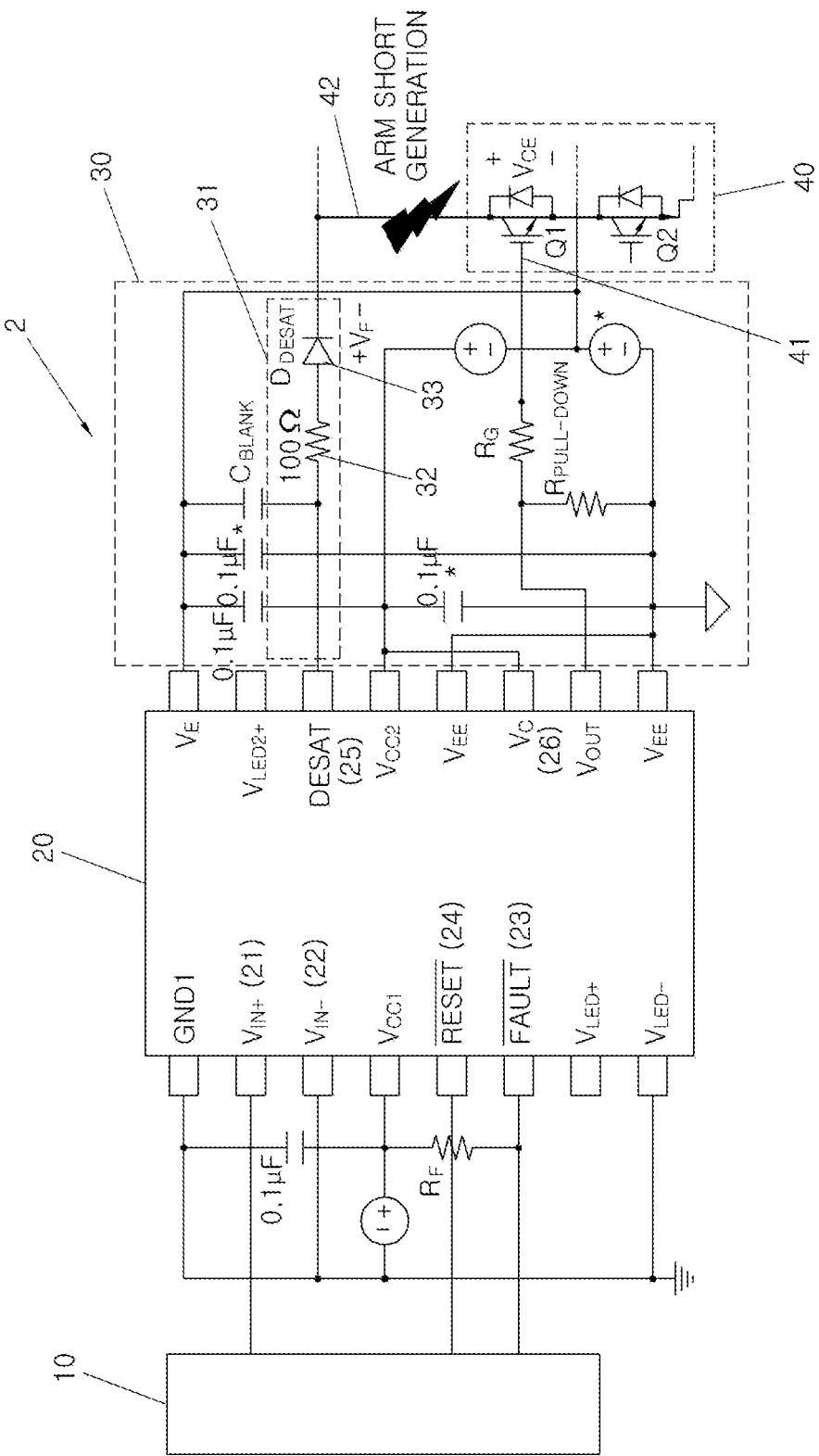
FIG. 2 is a circuit diagram illustrating the inverter gate drive board to which the gate driver circuit is applied.
Figure 3:
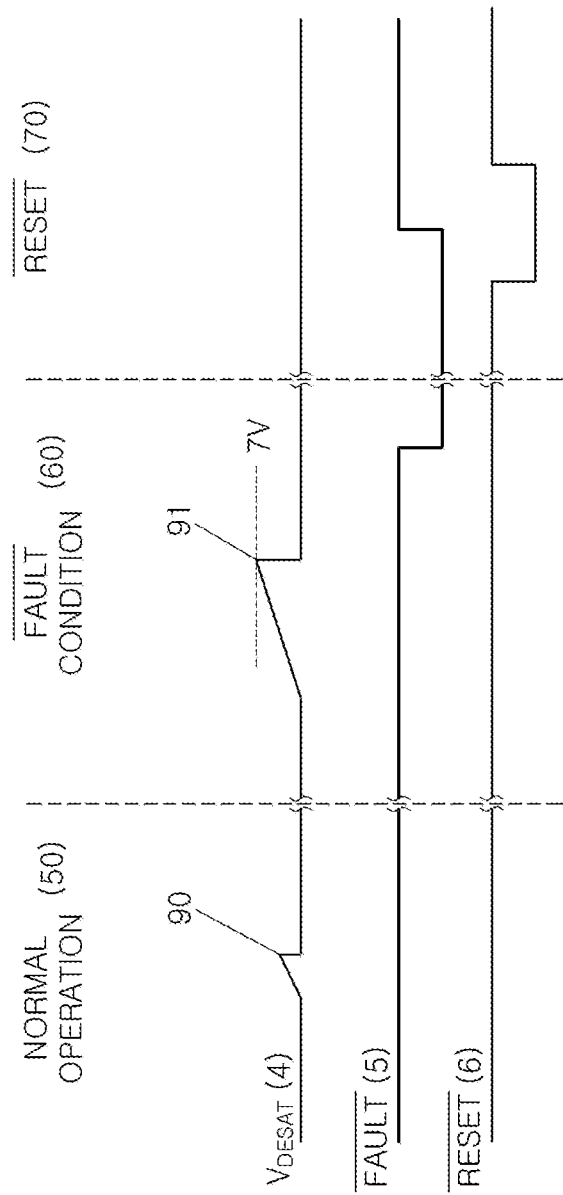
FIG. 3 is a diagram illustrating an input/output waveform of a drive IC in the inverter gate drive board to which the gate driver circuit is applied.
Figure 4:
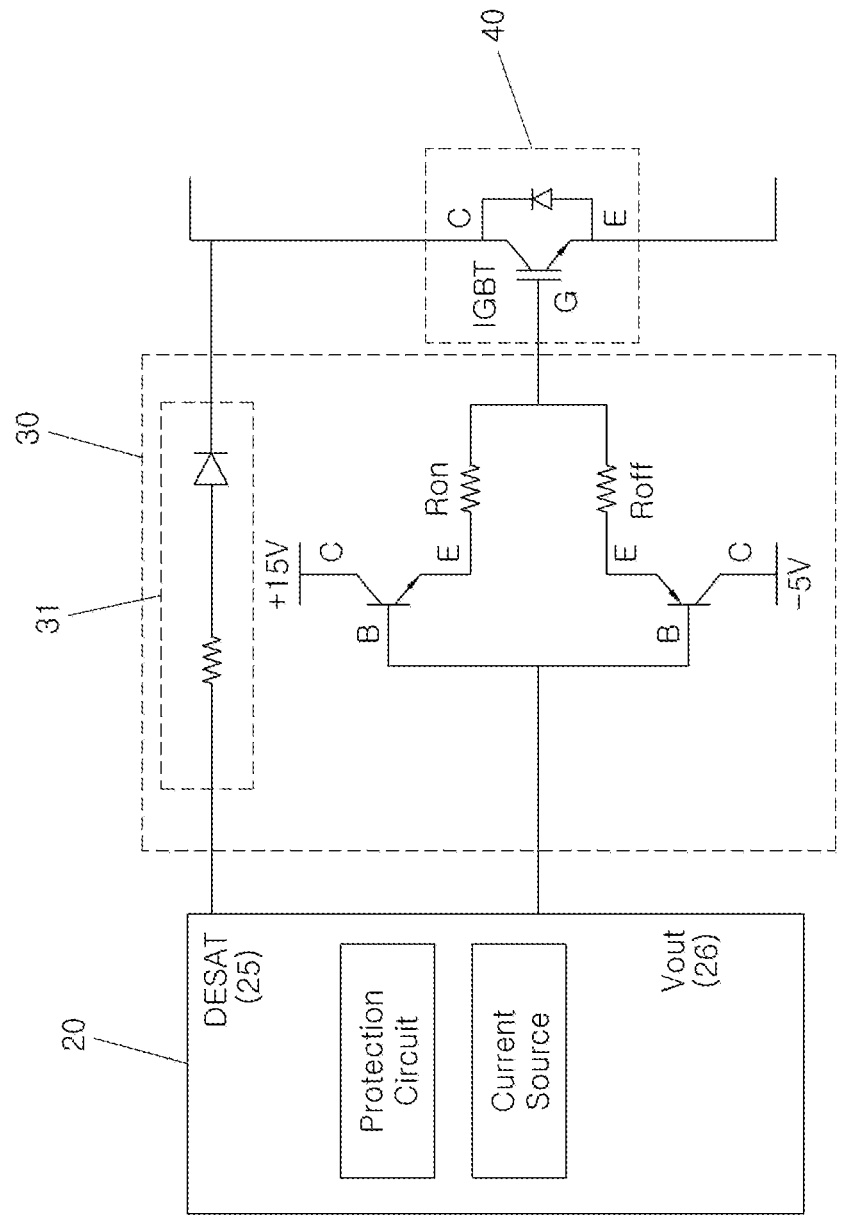
FIG. 4 is a block diagram illustrating the gate driver circuit.

FIG. 1 is a conceptual diagram illustrating an inverter gate drive board to which a gate driver circuit according to an example is applied. FIG. 2 is a circuit diagram illustrating the inverter gate drive board to which the gate driver circuit is applied. FIG. 3 is a diagram illustrating an input/output waveform of a driver IC in the inverter gate drive board to which the gate driver circuit is applied. FIG. 4 is a block diagram illustrating the inverter gate drive board to which the gate driver circuit is applied.

Referring to FIGS. 1 to 4, an inverter gate drive board 2 mounted in a hybrid or electric vehicle may include a microcomputer 10, a drive controller (driver IC) 20, a gate driver circuit 30 for driving a semiconductor device (IGBT; Insulated Gate Bipolar Transistor) 40 as a power semiconductor device, and a component such as the semiconductor device 40. In addition, the inverter gate drive board 2 may include an arm short protection circuit 31 for allowing the driving of the semiconductor device 40 to be instantly stopped when an arm short is generated in the gate driver circuit 30, an over-temperature protection circuit, and the like which are mounted to the component. Here, the inverter gate drive board 2 may be a device which converts electric energy as power of the hybrid or electric vehicle, and the semiconductor device 40 may be a high-capacity IGBT for power.

In more detail, the inverter gate drive board 2 necessarily includes a protection circuit for protecting the inverter gate drive board 2 in order to improve durability thereof. The protection circuit representatively includes an arm short protection circuit 31 for protecting the inverter gate drive board 2 by detecting a saturation voltage of the semiconductor device 40 when an arm short 3 or an over current is generated at a high side and a low side of the semiconductor device 40, and a UVLO (Under Voltage Lock Out) protection circuit operated when a gate voltage level is equal to or less than 12V. The protection circuit also includes a protection circuit which allow the microcomputer 10 to block a gate drive signal (PWM signal), when the semiconductor device 40 has a temperature equal to or greater than a predetermined value, by monitoring a temperature detection device (NTC resistance) mounted in the inverter gate drive board 2 including the semiconductor device 40. Here, the arm short 3 may mean a phenomenon in which the semiconductor device 40 is damaged (cut off) when a value equal to or greater than the saturation voltage is applied to a collector C of the semiconductor device 40.

Referring to FIGS. 1 to 4, the configuration and operation of the arm short protection circuit 31 mounted in the inverter gate drive board 2 to prevent damage of the semiconductor device 40 are as follows. The arm short protection circuit 31 may include a resistance 32 connected to a DESAT pin 25 of the driver IC 20 and a DESAT diode 33 which is connected in series to the resistance 32 and is connected in series to the collector 42 of the semiconductor device 40. The arm short protection circuit 31 is operated such that the drive controller 20 transmits a fault signal to the microcomputer 10 when a sum of a voltage of the resistance 32, a voltage of the DESAT diode 33, and a voltage Vice of the semiconductor device 40 is equal to or greater than a predetermined value, and the microcomputer 10 receiving the fault signal blocks a gate drive signal (PWM signal).

In more detail, in order to block the arm short or the over current 3 generated in the gate driver circuit 30, the drive controller 20 monitors whether or not the sum of the voltage of the resistance 32, the voltage of the DESAT diode 33, and the voltage Vce of the semiconductor device 40 is equal to or greater than the predetermined value using the DESAT pin 25. Subsequently, the drive controller 20 transmits the fault signal to the microcomputer 10 when the summed voltage is equal to or greater than the predetermined value, and the microcomputer 10 receiving the fault signal blocks the gate drive signal transmitted to a gate 41 of the gate driver circuit 30 by the drive controller 20 by retransmitting a reset signal to the drive controller 20 and resetting the drive controller 20. Here, the voltage for determining whether or not the arm short is generated may be 7V.

In other words, when the inverter gate drive board 2 is normally operated, the microcomputer 10 transmits the gate drive signal to the drive controller 20. Subsequently, the semiconductor device 40 is driven when the drive controller 20 transmits a drive signal (PWM signal) converted from the gate drive signal to the semiconductor device 40. However, when the arm short 3 is generated in the inverter gate drive board 2, the drive controller 20 monitors whether or not the sum of the voltage of the resistance 32, the voltage of the DESAT diode 33, and the voltage Vce of the semiconductor device 40 is equal to or greater than the predetermined value using the DESAT pin 25. The drive controller 20 transmits the fault signal to the microcomputer 10 when the summed voltage is equal to or greater than the predetermined value. The microcomputer 10 receiving the fault signal blocks the gate drive signal transmitted to the gate driver circuit 30 by the drive controller 20 by transmitting the reset signal to the drive controller 20 and resetting the drive controller 20.

Referring to FIG. 3, when the gate driver circuit 30 is normally operated (50), that is, when a DESAT pin voltage 4 detected by the DESAT pin 25 of the drive controller 20 is less than 7V indicative of the arm short, the drive controller 20 receives the gate drive signal from the microcomputer 10 through voltage input terminals 21 and 22 and normally outputs the gate drive signal 5 through a voltage output terminal 26. In this case, a fault signal output terminal 23 and a reset signal input terminal 24 of the drive controller 20 maintain a voltage applied state indicative of normality.

When the arm short is generated and reset in the gate driver circuit 30 (60 and 70), that is, when the DESAT pin voltage 4 detected by the DESAT pin 25 of the drive controller 20 is equal to or greater than 7V indicative of the arm short, a voltage 8 of the fault signal output terminal 23 connected to the microcomputer 10 is changed to 0V indicative of fault after a predetermined delay time. Subsequently, the microcomputer 10 changes a reset terminal voltage 9 of the drive controller 20 to 0V indicative of reset after a predetermined delay time again, so that the drive controller 20 is reset.

Such an arm short prevention method has an advantage capable of protecting the inverter gate drive board 2 by rapidly blocking the gate drive signal when the arm short 3 is generated in the gate driver circuit 30.

However, the arm short prevention method performs only an operation of protecting the inverter gate drive board 2 including the semiconductor device 40 by blocking the driving of the semiconductor device 40 in an abnormal case in which the arm short is generated in the semiconductor device 40. That is, there is a limit to application of the arm short prevention method to the inverter gate drive board 2 which continuously operates in the hybrid or electric vehicle. Accordingly, there is a need for a gate driver circuit and a gate driving method capable of rapidly detecting abnormality such as generation of the arm short so as to overcome the abnormality.

Figure 5:
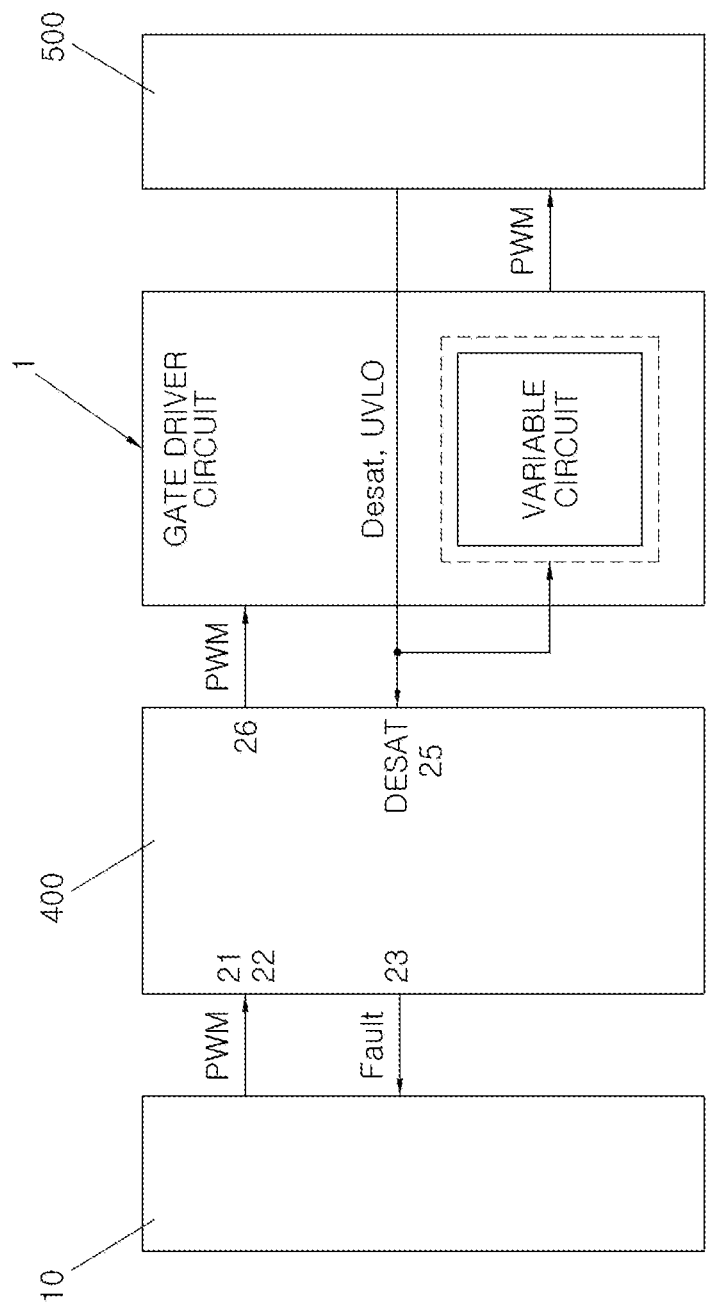
FIG. 5 is a conceptual diagram illustrating an inverter gate drive board to which a gate driver circuit according to an embodiment of the present invention is applied.
Figure 6:
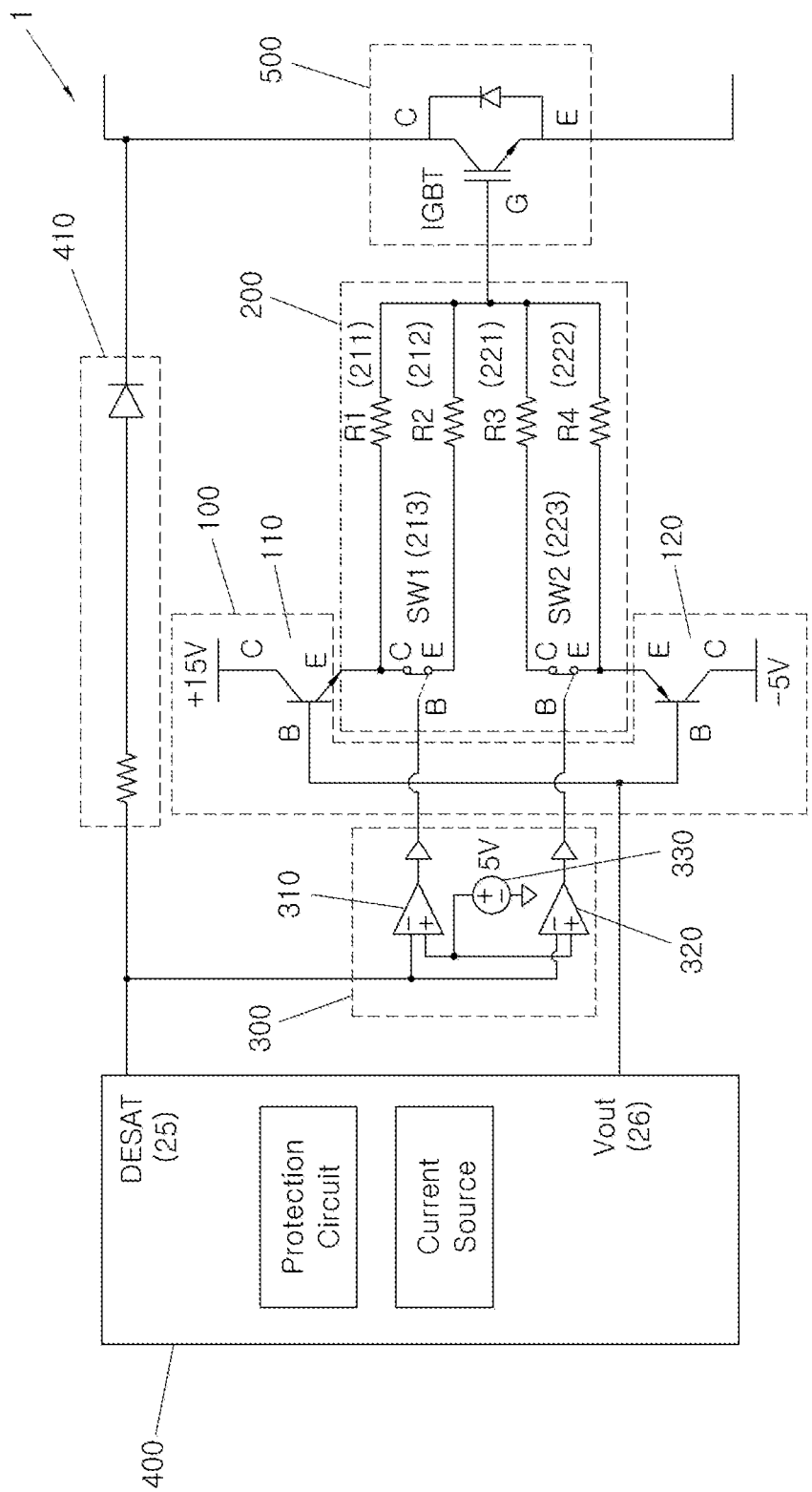
FIG. 6 is a circuit diagram illustrating closed states of first and second switch devices in the gate driver circuit according to the embodiment of the present invention.
Figure 7:
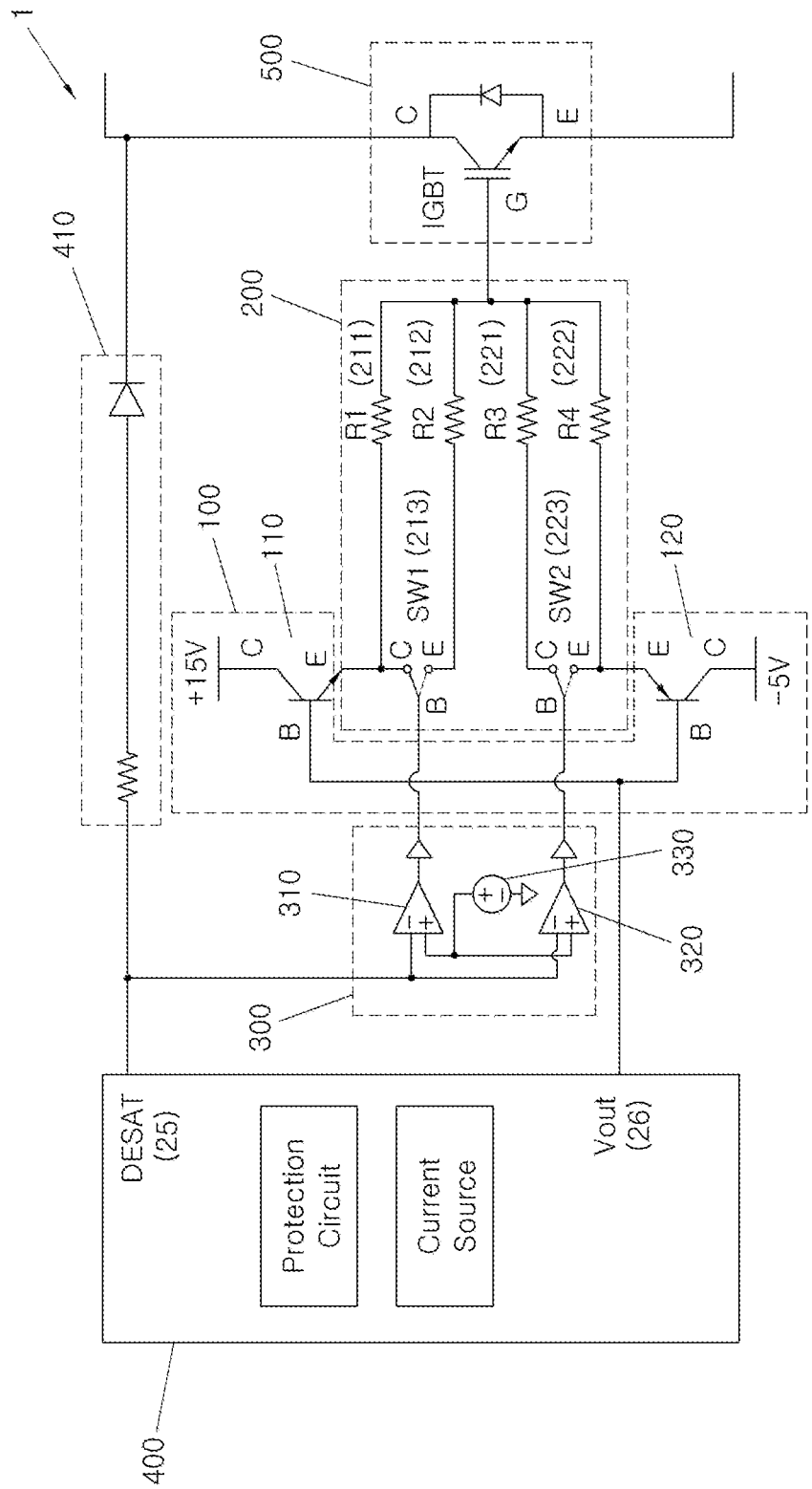
FIG. 7 is a circuit diagram illustrating opened states of the first and second switch devices in the gate driver circuit according to the embodiment of the present invention.

FIG. 5 is a conceptual diagram illustrating an inverter gate drive board to which a gate driver circuit according to an embodiment of the present invention is applied. FIG. 6 is a circuit diagram illustrating closed states of first and second switch devices in the gate driver circuit according to the embodiment of the present invention. FIG. 7 is a circuit diagram illustrating opened states of the first and second switch devices in the gate driver circuit according to the embodiment of the present invention.

Referring to FIGS. 5 to 7, the gate driver circuit for prevention of an arm short according to the embodiment of the present invention may include a drive signal transfer portion 100, a variable resistance portion 200, a resistance controller 300, and a drive controller (driver IC) 400.

The drive signal transfer portion 100 amplifies a gate drive signal input from the drive controller 400 and outputs the amplified gate drive signal to the variable resistance portion 200. In more detail, the drive signal transfer portion 100 amplifies the gate drive signal output and input by the drive controller 400 and outputs the amplified gate drive signal to the variable resistance portion 200, thereby enabling the variable resistance portion 200 to change a time constant of the amplified gate drive signal. Here, the gate drive signal may be a PWM (Pulse Width Modulation) signal. In more detail, the drive signal transfer portion 100 may include a first transistor 110 and a second transistor 120.

The first transistor 110 may amplifies the gate drive signal input to a base thereof. In this case, a voltage of 15V may be applied to a collector of the first transistor 110 and an emitter of the first transistor 110 may be connected to the variable resistance portion 200. In more detail, the first transistor 110 may amplify the gate drive signal input to the base using the voltage of 15V applied to the collector, and output the amplified gate drive signal to the variable resistance portion 200 through the emitter.

The second transistor 120 may amplifies the gate drive signal input to a base thereof. In this case, a voltage of −5V may be applied to a collector of the second transistor 120 and an emitter of the second transistor 120 may be connected to the variable resistance portion 200. In more detail, the second transistor 120 may amplify the gate drive signal input to the base using the voltage of −5V applied to the collector, and output the amplified gate drive signal to the variable resistance portion 200 through the emitter.

The variable resistance portion 200 changes the time constant of the amplified gate drive signal input using internal resistances 210 and 220 and outputs the amplified gate drive signal having the changed time constant to a gate of a semiconductor device 500. In more detail, the variable resistance portion 200 changes the internal resistances 210 and 220 connected to the gate 501 of the semiconductor device 500 according to control of the resistance controller 300, thereby enabling the time constant of the amplified gate drive signal to be changed so that the amplified gate drive signal having the changed time constant is output to the gate of the semiconductor device 500. Here, the semiconductor device 500 may be a high-capacity IGBT (Insulated Gate Bipolar Transistor) for power. In more detail, the variable resistance portion 200 may include a first resistance portion 210 and a second resistance portion 220.

The first resistance portion 210 may be configured such that a second resistance (R2) 212 is connected in parallel to a first resistance (R1) 211, a first switch device (SW1) 213 is connected in parallel to the first resistance 211, and the first switch device 213 is connected in series to the second resistance 212. In this case, one end of the first resistance 211 may be connected to the emitter of the first transistor 110 and the other end of the first resistance 211 may be connected to one end of a fourth resistance (R4) 222 and the gate of the semiconductor device 500. In addition, the first switch device 213 may be connected to an output terminal of a first operational amplifier 310 of the resistance controller 300. In particular, a base of the first switch device 213 may be connected to the output terminal of the first operational amplifier 310 of the resistance controller 300. Here, the first switch device 213 may be a transistor.

The second resistance portion 220 may be configured such that a third resistance (R3) 221 is connected in parallel to the fourth resistance 222, a second switch device (SW2) 223 is connected in parallel to the fourth resistance 222, and the second switch device 223 is connected in series to the third resistance 221. In this case, one end of the fourth resistance 222 may be connected to the other end of the first resistance 211 and the other end of the fourth resistance 222 may be connected to the emitter of the second transistor 120.

In addition, the second switch device 223 may be connected to an output terminal of a second operational amplifier 320 of the resistance controller 300. In particular, a base of the second switch device 222 may be connected to the output terminal of the second operational amplifier 320 of the resistance controller 300. Here, the second switch device 223 may be a transistor.

The resistance controller 300 compares a DESAT pin voltage 6 of the drive controller 400 with a predetermined value, and controls internal resistances 210 and 220 of the variable resistance portion 200 using the comparison result with the predetermined value. In more detail, when the resistance controller 300 compares the DESAT pin voltage 6 of the drive controller 400 with the predetermined value and determines that the DESAT pin voltage 6 exceeds the predetermined value, the resistance controller 300 may open (OFF) the first switch device 213 of the variable resistance portion 200 and close (ON) the second switch device 223. In addition, when the resistance controller 300 compares the DESAT pin voltage 6 of the drive controller 400 with the predetermined value and determines that the DESAT pin voltage 6 is equal to or less than the predetermined value, the resistance controller 300 may close (ON) the first switch device 213 of the variable resistance portion 200 and open (OFF) the second switch device 223. That is, the resistance controller 300 compares the DESAT pin voltage 6 of the drive controller 400 with the predetermined value, and then closes (ON) or opens (OFF) the first and second switch devices 213 and 223 using the comparison result with the predetermined value, so as to control a resistance value of the first resistance portion 210 and a resistance value of the second resistance portion 220 of the variable resistance portion 220. Here, the predetermined value refers to a voltage which is at risk of generating an arm short 3. The predetermined voltage may be a voltage of a reference voltage source 330, may be obtained through an experiment, and particularly may be 5V. In more detail, the resistance controller 300 may include the first operational amplifier 310, the second operational amplifier 320, and the reference voltage source 330.

An input terminal of the first operational amplifier 310 may be connected to a DESAT pin 25 of the drive controller 400 and the reference voltage source 330, and the output terminal of the first operational amplifier 310 may be connected to the first switch device 213 of the variable resistance portion 200. In particular, the input terminal of the first operational amplifier 310 may be connected to the DESAT pin 25 of the drive controller 400 and the reference voltage source 330, and the output terminal of the first operational amplifier 310 may be connected to the base of the first switch device 213 of the variable resistance portion 200. Here, the first switch device 213 may be a transistor.

An input terminal of the second operational amplifier 320 may be connected to the DESAT pin 25 of the drive controller 400 and the reference voltage source 330, and an output terminal of the second operational amplifier 320 may be connected to the second switch device 223 of the variable resistance portion 200. In particular, the input terminal of the second operational amplifier 320 may be connected to the DESAT pin 25 of the drive controller 400 and the reference voltage source 330, and the output terminal of the second operational amplifier 320 may be connected to the base of the second switch device 223 of the variable resistance portion 200. Here, the second switch device 223 may be a transistor.

The reference voltage source 330 may be connected to the input terminal of the first operational amplifier 310 and the input terminal of the second operational amplifier 320. In addition, the reference voltage source 330 may be separately installed without being included in the resistance controller 300. Here, the voltage of the reference voltage source 330 may be a reference voltage for predicting the arm short 3, may be changed, and particularly may be 5V.

The drive controller 400 compares the DESAT pin voltage 6 with a certain value, and controls the output of the gate drive signal using the comparison result with the certain value. In more detail, when the drive controller 400 compares the DESAT pin voltage 6 with the certain value and determines that the DESAT pin voltage 6 is equal to or greater than the certain value, the drive controller 400 may stop the output of the gate drive signal output from a voltage output terminal 26 of the drive controller 400. In this case, when the DESAT pin voltage 6 is equal to or greater than the certain value, it may be determined that the arm short 3 is generated. In addition, when the drive controller 400 compares the DESAT pin voltage 6 with the certain value and determines that the DESAT pin voltage 6 is less than the certain value, the drive controller 400 may allow the resistance controller 300 to compare the DESAT pin voltage 6 of the drive controller 400 with the certain value again. That is, the drive controller 400 compares the DESAT pin voltage 6 with the certain value, and then stops or continues to perform the output of the gate drive signal output from the voltage output terminal 26 of the drive controller 400 using the comparison result with the certain value, so as to control the operation of the semiconductor device 500. In addition, the drive controller 40 may be included in the driver IC connected to a microcomputer 10. Here, the certain value refers to a voltage for determining whether or not the arm short 3 is generated, may be obtained through an experiment with no limits, and particularly may be 7V. Meanwhile, the drive controller 40 may not be included in the gate driver circuit for prevention of an arm short according to the embodiment of the present invention.

In addition, the DESAT pin 25 of the drive controller 400 may be connected to an arm short protection circuit 410 for detecting the arm short 3. The arm short protection circuit 410 may include a resistance and a DESAT diode. When the drive controller 400 determines that a sum of a voltage of the resistance, a voltage of the DESAT diode, and a voltage Vice of the semiconductor device (IGBT) 500 is equal to or greater than a predetermined value through the DESAT pin 25, the arm short protection circuit 410 may detect generation of the arm short 3.

Hereinafter, a gate driving method for prevention of an arm short according to an embodiment of the present invention will be described with reference to the accompanying drawings.

Figure 8:
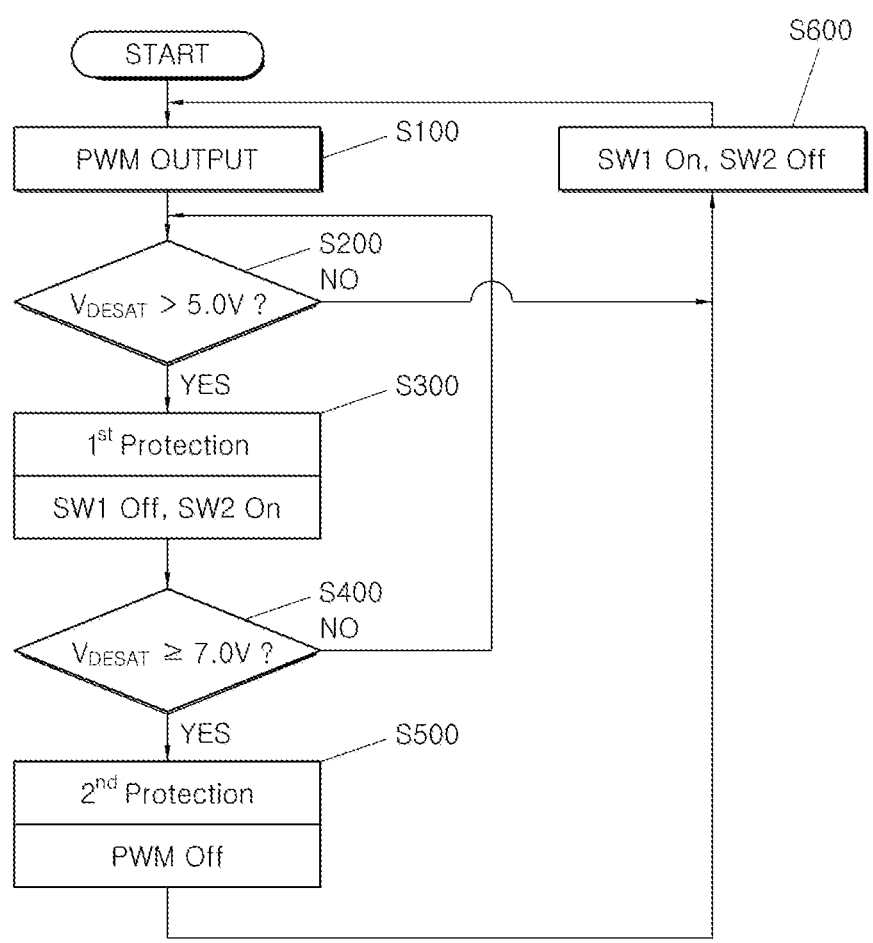
FIG. 8 is a flowchart illustrating a method of operating a gate driver circuit according to an embodiment of the present invention.

FIG. 8 is a flowchart illustrating a method of operating a gate driver circuit according to an embodiment of the present invention.

Referring to FIG. 8, the gate driving method for prevention of an arm short according to the embodiment of the present invention may include a drive signal output step S100, an arm short prediction step S200, a first driver circuit protection step S300, an arm short detection step S400, a second driver circuit protection step S500, and a driver circuit reoperation step S600.

In the drive signal output step S100, a drive controller 400 outputs a gate drive signal. In more detail, in the drive signal output step S100, the drive controller 400 may output the gate drive signal to a drive signal transfer portion 100 of a gate driver circuit 1 according to an embodiment of the present invention such that the gate driver circuit 1 according to the embodiment of the present invention drives a semiconductor device 500. Subsequently, the drive signal transfer portion 100 may amplify the gate drive signal and the amplified gate drive signal may be input to a variable resistance portion 200. A time constant of the amplified gate drive signal is changed in the variable resistance portion 200, and the gate drive signal having the changed time constant is input to the semiconductor device 500 so that the semiconductor device 500 is driven. Here, the gate drive signal may be a PWM (Pulse Width Modulation) signal, and the semiconductor device 500 may be a high-capacity IGBT (Insulated Gate Bipolar Transistor) for power.

In the arm short prediction step S200, a resistance controller 300 determines whether or not a DESAT pin voltage 6 of the drive controller 400 exceeds a predetermined value. In more detail, in the arm short prediction step S200, the resistance controller 300 connected to a DESAT pin 25 of the drive controller 400 may detect whether or not the DESAT pin voltage 6 of the drive controller 400 exceeds the predetermined value to determine whether or not an arm short 3 is at risk of being generated. In this case, the arm short 3 may be generated when the DESAT pin voltage 6 exceeds the predetermined value and the arm short 3 may not be generated when the DESAT pin voltage 6 is equal to or less than the predetermined value. Here, the predetermined value may refer to a voltage which is at risk of generating the arm short 3, and may be obtained through an experiment with no limits. In addition, the predetermined voltage may be a voltage of a reference voltage source 330 in the resistance controller 300, and particularly may be 5V.

Meanwhile, when the DESAT pin voltage 6 of the drive controller 400 is equal to or less than the predetermined value in the arm short prediction step S200, the driver circuit reoperation step S600 in which the resistance controller 300 closes (ON) a first switch device (SW1) 213 of the variable resistance portion 200 and opens (OFF) a second switch device (SW2) 223 may be performed. In more detail, when the DESAT pin voltage 6 of the drive controller 400 is equal to or less than the predetermined value in the arm short prediction step S200, namely, when the arm short 3 is not at risk of being generated, the resistance controller 300 closes (ON) the first switch device 213 of the variable resistance portion 200 to specify a resistance value $R_{S1}$ of a first resistance portion 210 and opens (OFF) the second switch device 223 to specify a resistance value $R_{S2}$ of a second resistance portion 220. Consequently, the time constant of the gate drive signal input to the variable resistance portion 200 may be changed. That is, when the DESAT pin voltage 6 of the drive controller 400 is equal to or less than the predetermined value in the arm short prediction step S200, namely, when the arm short 3 is not at risk of being generated, the driver circuit reoperation step S600 is performed and the gate driver circuit 1 is continuously and normally operated. Meanwhile, after the driver circuit reoperation step S600, the drive signal output step S100 may be performed again.

In this case, the resistance value $R_{S1}$ of the first resistance portion 210 and the resistance value $R_{S2}$ of the second resistance portion 220 in the variable resistance portion 200 may be calculated by the following equations.

$$R_{S1} = \frac{R1 \times R2}{R1 + R2} \qquad \text{[Equation 1]}$$

-continued $$R_{S2} = R4 \quad \text{[Equation 2]}$$

Here, R1 refers to a resistance value of a first resistance 211, R2 refers to a resistance value of a second resistance 212, and R4 refers to a resistance value of a fourth resistance 222.

In the first driver circuit protection step S300, when the DESAT pin voltage 6 of the drive controller 400 exceeds the predetermined value, the resistance controller 300 opens (OFF) the first switch device 213 of the variable resistance portion 200 and closes (ON) the second switch device 223. In more detail, in the first driver circuit protection step S300, when the DESAT pin voltage 6 of the drive controller 400 exceeds the predetermined value, namely, when the arm short 3 is at risk of being generated, the resistance controller 300 opens (OFF) the first switch device 213 of the variable resistance portion 200 to specify the resistance value $R_{S1}$ of the first resistance portion 210 and closes (ON) the second switch device 223 to specify the resistance value $R_{S2}$ of the second resistance portion 220. Consequently, the time constant of the gate drive signal input to the variable resistance portion 200 may be changed. That is, in the first driver circuit protection step S300, when the DESAT pin voltage 6 of the drive controller 400 exceeds the predetermined value, namely, when the arm short 3 is at risk of being generated, the resistance controller 300 controls the gate driver circuit 1 such that the time constant of the gate drive signal input to the variable resistance portion 200 is changed. Consequently, the gate driver circuit 1 is continuously and normally operated.

In this case, the resistance value $R_{S1}$ of the first resistance portion 210 and the resistance value $R_{S2}$ of the second resistance portion 220 in the variable resistance portion 200 may be calculated by the following equations.

$$R_{S1} = R1 \quad \text{[Equation 3]}$$

$$R_{S2} = \frac{R3 \times R4}{R3 + R4} \quad \text{[Equation 4]}$$

Here, R1 refers to a resistance value of a first resistance 211, R3 refers to a resistance value of a third resistance 221, and R4 refers to a resistance value of a fourth resistance 222.

In the arm short detection step S400, the drive controller 400 determines whether or not the DESAT pin voltage 6 is equal to or greater than a certain value. In more detail, in the arm short detection step S400, the drive controller 400 including a DESAT pin 25 may detect whether or not the DESAT pin voltage 6 is equal to or greater than the certain value to determine whether or not an arm short 3 is generated. In this case, the arm short 3 may be generated when the DESAT pin voltage 6 is equal to or greater than the certain value and the arm short 3 may not be generated when the DESAT pin voltage 6 is less than the certain value. Here, the certain value may refer to a reference voltage for determining whether or not the arm short is generated, may be obtained through an experiment with no limits, and particularly may be 7V.

Meanwhile, when the DESAT pin voltage 6 is less than the certain value in the arm short detection step S400, the arm short prediction step S200 may be performed again. In more detail, when the DESAT pin voltage 6 exceeds the predetermined value and is less than the certain value in the arm short detection step S400, namely, when the arm short is at risk of being generated but is not actually generated, the arm short prediction step S200 of determining whether or not the arm short is at risk of being generated may be performed again.

In the second driver circuit protection step S500, the drive controller 400 stops output of the gate drive signal when the DESAT pin voltage 6 is equal to or greater than the certain value. In more detail, in the second driver circuit protection step S500, when the DESAT pin voltage 6 is equal to or greater than the certain value, namely, when the arm short 3 is at risk of being generated and is actually generated, the drive controller 400 stops the output of the gate drive signal output to the drive signal transfer portion 100 through a voltage output terminal 26, thereby enabling the gate driver circuit 1 to be prevented from being damaged due to the generation of the arm short 3. That is, when the DESAT pin voltage 6 is equal to or greater than the certain value in the second driver circuit protection step S500, namely, when the arm short 3 is generated, the drive controller 400 stops the output of the gate drive signal and stops the operation of the gate driver circuit 1, thereby removing the generated arm short 3. Here, the gate drive signal may be a PWM (Pulse Width Modulation) signal.

In the driver circuit reoperation step S600, the resistance controller 300 closes (ON) the first switch device 213 of the variable resistance portion 200 and opens (OFF) the second switch device 223. In more detail, in the driver circuit reoperation step S600, after the second driver circuit protection step S500, namely, after the arm short 3 is removed, the resistance controller 300 closes (ON) the first switch device 213 of the variable resistance portion 200 to specify the resistance value $R_{S1}$ of the first resistance portion 210 and opens (OFF) the second switch device 223 to specify the resistance value $R_{S2}$ of the second resistance portion 220. Consequently, the resistance controller 300 may control the gate driver circuit such that the time constant of the gate drive signal input to the variable resistance portion 200 is changed. That is, in the driver circuit reoperation step S600, the internal resistances 210 and 220 of the variable resistance portion 220 may be controlled such that the time constant of the gate drive signal input to the variable resistance portion 200 is changed after the operation of the gate driver circuit 1 is stopped and the arm short 3 is removed. Subsequently, in the drive signal output step S100 in which the drive controller 400 outputs the gate drive signal, the gate driver circuit 1 may be normally reoperated. Meanwhile, after the driver circuit reoperation step S600, the drive signal output step S100 may be performed again.

In accordance with a gate driver circuit and a gate driving method for prevention of an arm short according to the embodiments of the present invention, it may be possible to previously prevent an arm short so as to prevent damage of the gate driver circuit by changing a time constant of a gate drive signal before the arm short is generated.

In addition, in accordance with the gate driver circuit and the gate driving method for prevention of an arm short according to the embodiments of the present invention, it may be possible to prevent damage of the gate driver circuit by stopping output of the gate drive signal and stopping an operation of the gate driver circuit when the arm short is generated. It may be possible to reoperate the gate driver circuit by controlling an internal resistance such that the time constant of the gate drive signal is changed after the operation of the gate driver circuit is stopped.

In embodiments, a gate driver circuit for use in a vehicle may comprise a circuit arrangement for protecting the gate driver circuit from arm short-circuit. The gate driver circuit may comprise: a drive controller configured to a gate drive signal; a drive signal transfer circuit portion configured to amplify the gate drive signal and output the amplified gate drive signal; a variable resistance circuit portion configured to change the time constant of the amplified gate drive signal using resistance and output the amplified gate drive signal having the changed time constant to a gate of an IGBT; and a resistance controller configured to compare a first DESAT pin voltage of the drive controller with a first predetermined reference value and control the resistance of the variable resistance circuit portion using the comparison result thereby protecting the gate driver circuit.

While the present invention has been described with respect to the specific embodiments, it will be apparent to those skilled in the art that various changes and modifications may be made without departing from the spirit and scope of the invention as defined in the following claims.

What is claimed is:

1. A motor control apparatus comprising:
a drive controller configured to output a gate drive signal;
a drive signal transfer circuit configured to amplify the gate drive signal and output the amplified gate drive signal;
a variable resistance circuit configured to change a time constant of the amplified gate drive signal using an internal resistance and output the amplified gate drive signal having the changed time constant to a gate of a semiconductor device; and
a resistance controller configured to compare a first DESAT pin voltage of the drive controller with a first predetermined reference value and further configured to control the internal resistance of the variable resistance circuit using the comparison result of the first DESAT pin voltage,
wherein the drive controller is further configured to compare a second DESAT pin voltage of the drive controller with a second predetermined reference value and further configured to generate a fault signal for blocking the gate drive signal from the drive controller depending upon the comparison result of the second DESAT pin voltage.

2. The apparatus of claim 1, wherein the drive signal transfer circuit comprises:
a first transistor configured to amplify a gate drive signal input to a base thereof; and
a second transistor configured to amplify a gate drive signal input to a base thereof.

3. The apparatus of claim 2, wherein:
a voltage of 15V is applied to a collector of the first transistor and an emitter of the first transistor is connected to the variable resistance circuit; and
a voltage of −5V is applied to a collector of the second transistor and an emitter of the second transistor is connected to the variable resistance circuit.

4. The apparatus of claim 1, wherein the variable resistance circuit comprises:
a first resistance circuit comprising a first resistance, a second resistance connected in parallel to the first resistance, and a first switch device connected in parallel to the first resistance and connected in series to the second resistance; and
a second resistance circuit comprising a third resistance, a fourth resistance connected in parallel to the third resistance, and a second switch device connected in parallel to the fourth resistance and connected in series to the third resistance.

5. The apparatus of claim 4, wherein:
one end of the first resistance is connected to an emitter of a first transistor and the other end of the first resistance is connected to one end of the fourth resistance and the gate of the semiconductor device;
one end of the fourth resistance is connected to the other end of the first resistance and the other end of the fourth resistance is connected to an emitter of a second transistor;
the first switch device is connected to an output terminal of a first operational amplifier of the resistance controller; and
the second switch device is connected to an output terminal of a second operational amplifier of the resistance controller.

6. The apparatus of claim 1, wherein the resistance controller comprises:
a first operational amplifier configured such that an input terminal of the first operational amplifier is connected to a DESAT pin of the drive controller and a reference voltage source and an output terminal of the first operational amplifier is connected to a first switch device of the variable resistance circuit; and
a second operational amplifier configured such that an input terminal of the second operational amplifier is connected to the DESAT pin of the drive controller and the reference voltage source and an output terminal of the second operational amplifier is connected to a second switch device of the variable resistance circuit.

7. The apparatus of claim 1, wherein the gate drive signal is a PWM (Pulse Width Modulation) signal.

8. The apparatus of claim 1, wherein the semiconductor device is a high-capacity IGBT (Insulated Gate Bipolar Transistor) for supplying power to motor in a hybrid vehicle or an electric vehicle.

9. The apparatus of claim 1, wherein the second DESAT pin voltage is sum of voltages of a resistor and a diode which are composed between a DESAT pin and the semiconductor device and a saturation voltage of the semiconductor device.

10. A gate driving method for prevention of an arm short, comprising:
performing drive signal output in which a drive controller outputs a gate drive signal;
performing gate drive signal amplification in which a drive signal transfer circuit amplifies the gate drive signal and outputs the amplified gate drive signal;
performing arm short prediction in which a resistance controller determines whether or not the arm short prediction is generated comparing a first DESAT pin voltage of the drive with a first predetermined reference value
performing first driver circuit protection in which a variable resistance circuit changes a time constant of the amplified gate drive signal using an internal resistance according to the comparison result with the first predetermined reference value and outputs the amplified gate drive signal having the changed time constant to a gate of a semiconductor device to perform a first driver circuit protection;
subsequently, determining whether or not a second DESAT pin voltage is equal to or greater than a second predetermined reference value; and
when it is determined that the second DESAT pin voltage is equal to or greater than the second predetermined reference value, performing second driver circuit protection in which the drive controller transfers to a microcomputer a fault signal which blocks the gate drive signal to stop output of the gate drive signal.

11. The gate driving method of claim 10, wherein the performing drive signal output is performed again after driver circuit reoperation in which the resistance controller closes (ON) a first switch device of the variable resistance circuit and opens (OFF) a second switch device is performed when the first DESAT pin voltage of the drive controller is equal to or less than the first predetermined reference value in the performing arm short prediction.

12. The gate driving method of claim 11, wherein, in a case in which the resistance controller closes (ON) the first switch device of the variable resistance circuit and opens (OFF) the second switch device in the performing driver circuit reoperation, a resistance value ($R_{S1}$) of a first resistance circuit is calculated by the following equation:

$$R_{S1} = \frac{R1 \times R2}{R1 + R2}$$

(where, R1 refers to a resistance value of a first resistance, and R2 refers to a resistance value of a second resistance), and a resistance value ($R_{S2}$) of a second resistance circuit is calculated by the following equation:

$$R_{S2}=R4$$

(where, R4 refers to a resistance value of a fourth resistance).

13. The gate driving method of claim 10, wherein, in a case in which the resistance controller opens (OFF) a first switch device of the variable resistance circuit and closes (ON) a second switch device in the performing first driver circuit protection, a resistance value ($R_{S1}$) of a first resistance circuit is calculated by the following equation:

$$R_{S1}=R1$$

(where, R1 refers to a resistance value of a first resistance), and a resistance value ($R_{S2}$) of a second resistance circuit is calculated by the following equation:

$$R_{S2} = \frac{R3 \times R4}{R3 + R4}$$

(where, R3 refers to a resistance value of a third resistance, and R4 refers to a resistance value of a fourth resistance).

14. The gate driving method of claim 10, wherein the performing arm short prediction is performed again when the DESAT pin voltage is less than the certain value in the performing arm short detection.

15. The gate driving method of claim 10, wherein, after the performing second driver circuit protection, the performing drive signal output is performed again after driver circuit reoperation in which the resistance controller closes (ON) a first switch device of the variable resistance circuit and opens (OFF) a second switch device is performed.

16. The gate driving method of claim 10, wherein the second DESAT pin voltage is sum of voltages of a resistor and a diode which are composed between a DESAT pin and the semiconductor device and a saturation voltage of the semiconductor device.

* * * * *